US012587143B2

(12) United States Patent
Lehtola

(10) Patent No.: US 12,587,143 B2
(45) Date of Patent: Mar. 24, 2026

(54) POWER AMPLIFIER STABILITY ENHANCEMENT AT EXTREME CONDITIONS

(71) Applicant: SKYWORKS SOLUTIONS, INC., Irvine, CA (US)

(72) Inventor: Philip John Lehtola, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 765 days.

(21) Appl. No.: 17/956,413

(22) Filed: Sep. 29, 2022

(65) Prior Publication Data

US 2023/0097146 A1     Mar. 30, 2023

Related U.S. Application Data

(60) Provisional application No. 63/249,897, filed on Sep. 29, 2021.

(51) Int. Cl.
*H03F 1/30*          (2006.01)
*H03F 3/24*          (2006.01)

(52) U.S. Cl.
CPC ............. *H03F 1/301* (2013.01); *H03F 3/245* (2013.01); *H03F 2200/451* (2013.01); *H03F 2200/541* (2013.01)

(58) Field of Classification Search
None
See application file for complete search history.

(56) References Cited

U.S. PATENT DOCUMENTS 3,056,086 A * 9/1962 Brauner ................... H03G 3/34
                                                     455/220
2015/0349731 A1* 12/2015 Kwon ..................... H03F 1/565
                                                     330/296

* cited by examiner

*Primary Examiner* — Andrea Lindgren Baltzell
*Assistant Examiner* — Malane Lieng
(74) *Attorney, Agent, or Firm* — Chang & Hale LLP

(57) ABSTRACT

A power amplifier comprises a first transistor, a first transformer, a first variable resistor, a first bias circuit and coupling circuitry configured to couple the first transformer, a first end of the first variable resistor, and a collector of the first transistor at a first node, the first transformer and a second end of the first variable resistor at a second node, and the bias circuit and a base of the first transistor at a third node.

19 Claims, 7 Drawing Sheets

POWER AMPLIFIER STABILITY ENHANCEMENT AT EXTREME CONDITIONS

CROSS-REFERENCE TO RELATED APPLICATION

This application claims priority to U.S. Provisional Application No. 63/249,897 filed Sep. 29, 2021, entitled POWER AMPLIFIER STABILITY ENHANCEMENT AT EXTREME CONDITIONS, the disclosure of which is hereby expressly incorporated by reference herein in its respective entirety.

BACKGROUND

Some embodiments of the present disclosure relate to power amplifiers.

A power amplifier module and/or front-end module may have degraded stability at relatively cold temperatures. This degraded stability can occur for a variety of reasons, which can include the following: (1) a beta value (e.g., a ratio of collector current to base current) of the power amplifier transistors can increase as temperature decreases, causing higher gain; (2) equivalent series resistance (ESR) can decrease as temperature decreases in passive matching/filter inductors and/or capacitors, leading to lower loss at lower temperature; (3) radio frequency (RF) switch "on" resistance can decrease as temperature decreases, leading to lower loss and/or greater mismatch at lower temperatures; and/or (4) RF filter and/or duplexer loss (e.g., surface acoustic wave (SAW), thin-film bulk acoustic resonator (F-BAR), bulk acoustic wave (BAW)) can decrease as temperature decreases, leading to lower loss at lower temperature. Stability and/or ruggedness degradation of a power amplifier can occur at any temperatures below an ambient temperature and/or may increase proportionately with temperature drops.

SUMMARY

Some implementations of the present disclosure relate to a power amplifier including: a first transistor; a first transformer; a first variable resistor; a first bias circuit; and coupling circuitry configured to couple the first transformer, a first end of the first variable resistor, and a collector of the first transistor at a first node, the first transformer and a second end of the first variable resistor at a second node, and the first bias circuit and a base of the first transistor at a third node.

In some aspects, the techniques described herein relate to a power amplifier wherein the first transformer includes a primary inductor and a secondary inductor.

In some aspects, the techniques described herein relate to a power amplifier wherein the coupling circuitry is further configured to couple a first end of the primary inductor, the first end of the first variable resistor, and the collector of the first transistor at the first node.

In some aspects, the techniques described herein relate to a power amplifier wherein the coupling circuitry is further configured to couple a second end of the primary inductor and the second end of the first variable resistor at the second node.

In some aspects, the techniques described herein relate to a power amplifier further including a second variable resistor.

In some aspects, the techniques described herein relate to a power amplifier wherein the coupling circuitry is further configured to couple a first end of the secondary inductor to a first end of the second variable resistor.

In some aspects, the techniques described herein relate to a power amplifier wherein the coupling circuitry is further configured to couple a second end of the secondary inductor to a second end of the second variable resistor.

In some aspects, the techniques described herein relate to a power amplifier further including a third variable resistor.

In some aspects, the techniques described herein relate to a power amplifier wherein the coupling circuitry is further configured to couple a first end of the second variable resistor to the third variable resistor.

In some aspects, the techniques described herein relate to a power amplifier further including a fourth variable resistor.

In some aspects, the techniques described herein relate to a power amplifier wherein the coupling circuitry is further configured to couple a second end of the second variable resistor to the fourth variable resistor.

In some aspects, the techniques described herein relate to a power amplifier further including a second bias circuit.

In some aspects, the techniques described herein relate to a power amplifier wherein the coupling circuitry is further configured to couple the second bias circuit to the secondary inductor.

In some aspects, the techniques described herein relate to a power amplifier further including a capacitor coupled between the second bias circuit and the secondary inductor.

In some aspects, the techniques described herein relate to a power amplifier wherein the coupling circuitry is further configured to couple the first transformer in parallel with the first variable resistor.

In some aspects, the techniques described herein relate to a circuit including: a first transistor; a first transformer including a primary inductor and a secondary inductor; a first variable resistor; a first bias circuit; and coupling circuitry configured to couple a first end of the primary inductor, a first end of the first variable resistor, and a collector of the first transistor at a first node, a second end of the primary inductor and a second end of the first variable resistor at a second node, and the second bias circuit and a base of the first transistor at a third node.

In some aspects, the techniques described herein relate to a circuit further including a second bias circuit.

In some aspects, the techniques described herein relate to a circuit further including a second variable resistor.

In some aspects, the techniques described herein relate to a circuit wherein the coupling circuitry is further configured to couple second bias circuit to the second variable resistor.

In some aspects, the techniques described herein relate to a circuit wherein the coupling circuitry is further configured to couple the second variable resistor to the secondary inductor of the first transformer.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DESCRIPTION

Figure 1:
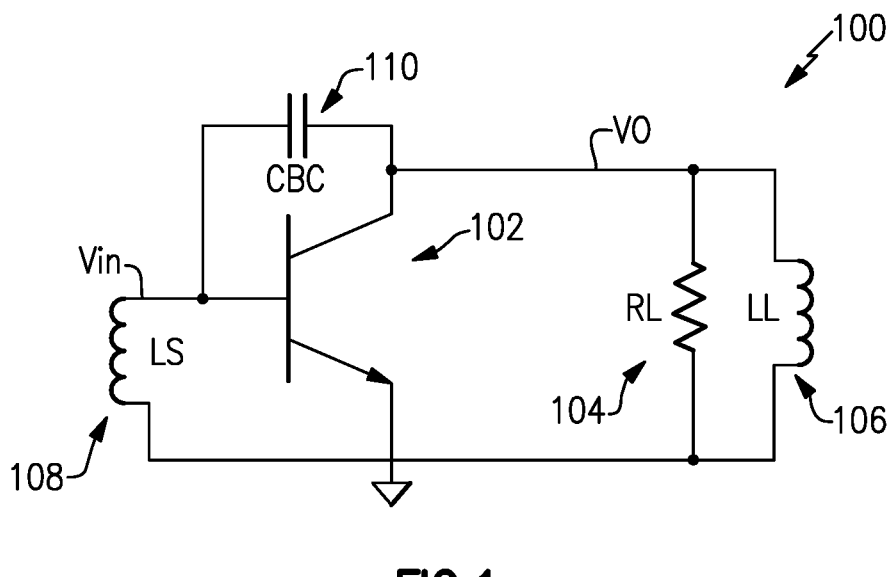
FIG. 1 illustrates a power amplifier comprising a phase shift oscillator (e.g., a Hartley oscillation amplifier).

The headings provided herein, if any, are for convenience only and do not necessarily affect the scope or meaning of the claimed invention.

A power amplifier module and/or front-end module may have degraded stability at relatively cold temperatures. This degraded stability can occur for a variety of reasons, which can include the following: (1) a beta value (e.g., a ratio of collector current to base current) of the power amplifier transistors can increase as temperature decreases, causing higher gain; (2) equivalent series resistance (ESR) can decrease as temperature decreases in passive matching/filter inductors and/or capacitors, leading to lower loss at lower temperature; (3) radio frequency (RF) switch "on" resistance can decrease as temperature decreases, leading to lower loss and/or greater mismatch at lower temperatures; and/or (4) RF filter and/or duplexer loss (e.g., surface acoustic wave (SAW), thin-film bulk acoustic resonator (F-BAR), bulk acoustic wave (BAW)) can decrease as temperature decreases, leading to lower loss at lower temperature. Stability and/or ruggedness degradation of a power amplifier can occur at any temperatures below an ambient temperature and/or may increase proportionately with temperature drops.

When stability is tested into a load voltage standing wave ratio (VSWR) and/or into a non-matched load, lower post-power amplifier losses at cold temperatures may translate to a higher VSWR presented to the power amplifier. Higher VSWR values presented to the power amplifier can make the power amplifier more susceptible to instability. Higher gain at lower temperatures can make the power amplifier more susceptible to instability. Power amplifier stability can be worst at cold temperatures. Some embodiments described herein can advantageously provide improved stability at cold temperatures without degrading the power, efficiency, and/or gain of the power amplifier at nominal conditions.

Some methods of improving stability at power amplifiers may involve adding dissipative loss (e.g., resistance) to the input and/or the output of the power amplifier. The added loss can improve the stability, but may degrade the power, efficiency, and/or gain of the power amplifier at nominal conditions.

In some embodiments, one or more shunt variable resistors may be added to the input of a power amplifier. The one or more variable resistors may be configured to provide relatively low resistance at cold temperatures (e.g., lower than ambient and/or at approximately −30-degrees Celsius)

and/or relatively high resistance at nominal and/or hot temperatures. If the one or more shunt resistors provide relatively high resistance at nominal temperatures, the resistors may present no and/or limited degradation to power, efficiency, and/or gain at nominal temperatures. By providing relatively little resistance at cold temperatures, the one or more shunt resistors can provide a dissipative termination to the input of the power amplifier at cold temperatures. This can result in improved stability and/or reduced gain at cold temperatures. In some embodiments, a power amplifier circuit can have an additional benefit of reducing the gain variation from nominal temperatures to cold temperatures.

A variable resistor may comprise a field-effect transistor (FET) that can be swept from low impedance to high impedance through a triode region of the FET. A fixed gate voltage and/or a variable/process compensated drain-source voltage may be applied to sweep the FET from low impedance to high impedance. A control voltage that may be proportional to temperature may be applied to the variable resistor to change the value as a function of temperature. The control voltage may be an analog control voltage, and/or there may be no discrete steps in the gain or stability performance as a function of temperature.

FIG. 1 illustrates a power amplifier 100 comprising a phase shift oscillator (e.g., a Hartley oscillation amplifier). The power amplifier 100 may comprise a transistor 102 (e.g., a bipolar junction transistor (BJT)), a resistor 104, a first inductor 106 in parallel with the resistor, a second inductor 108 coupled between a base of the transistor 102 and the resistor 104 and/or first inductor 106, and/or a capacitor 110 coupled between a collector and base of the transistor 102. Oscillation of the power amplifier 100 can be mitigated by adding dissipative loss (e.g., resistance) to the input of the power amplifier 100 and/or to the base of the transistor 102. The phase shift oscillator may be configured to be tuned for $f_0$. A 180° phase shift may be realized with a low pass oscillator and/or a high pass oscillator. Hartley oscillation may require high gain and/or an inductive load/source.

Figure 2:
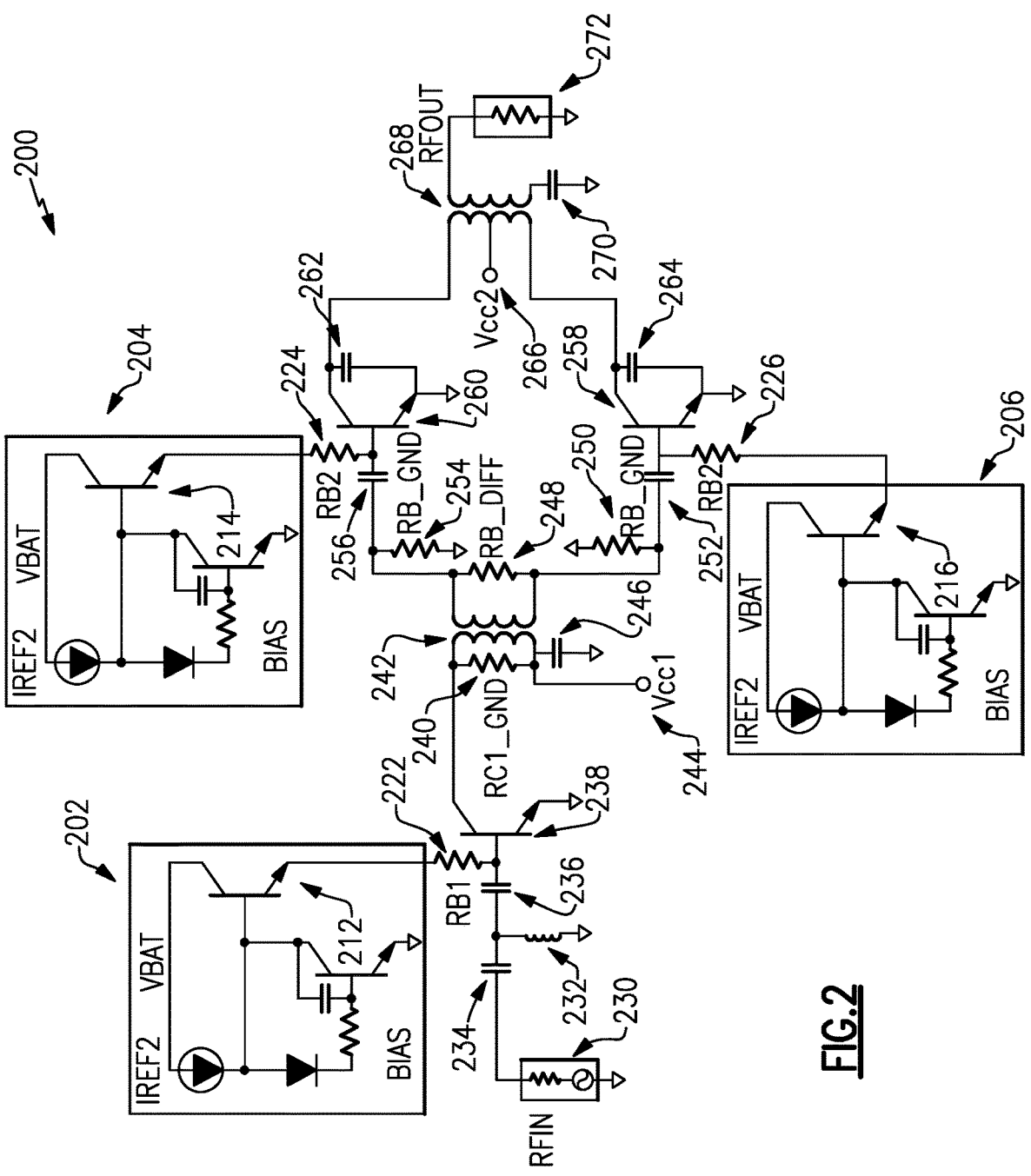
FIG. 2 illustrates a power amplifier having one or more fixed resistors in accordance with one or more embodiments.

In a Hartley oscillator, there may be very little control of the load impedance of the power amplifier 100. For example, low frequency impedance may be dominated by high-Q RF choke, high frequency impedance may be pulled over all phases by a load network, and/or VSWR presented to the power amplifier 100 may be worse at low temperatures. Moreover, in a Hartley oscillator, the transistor 102 and/or additional transistors can have parasitic feedback capacitance. Furthermore, a transistor with base-collector capacitance ($C_{BC}$) may only oscillate with an inductive load and/or inductive source. Accordingly, a high-pass filter may be required to achieve 180° phase shift and/or resistance may be required to be added to the input and/or output to dampen oscillation. A Hartley oscillator may not be realized with a capacitive source FIG. 2 illustrates a power amplifier 200 having one or more fixed resistors in accordance with one or more embodiments. The power amplifier may comprise a first bias circuit 202 including a first emitter follower 212 (e.g., a BJT), a second bias circuit 204 including a second emitter follower 214 (e.g., a BJT), and/or a third bias circuit 206 including a third emitter follower 216 (e.g., a BJT). A first bias resistor 222 may be coupled (e.g., via coupling circuitry) between the first emitter follower 212 and a first-stage transistor 238 (e.g., a BJT). A second bias resistor 224 may be coupled between the second emitter follower 214 and a first second-stage transistor 260 (e.g., a BJT). A third bias resistor 226 (e.g., having an equal resistance to the second bias resistor 224) may be coupled between the third emitter follower 216 and a second second-stage transistor 258 (e.g., a BJT).

The power amplifier 200 may comprise an RF input 230 and/or an RF output 272. The RF input 230 may comprise an oscillator and/or a resistor. The RF input 230 may be coupled to a first capacitor 234. The first capacitor 234, a first inductor 232, and/or a second capacitor 236 may be coupled together at a first node. The second capacitor 236, first bias resistor 222, and/or the base of the first-stage transistor 238 may be coupled together at a second node.

The power amplifier 200 may comprise a first transformer 242, which may include a primary inductor and/or a secondary inductor. The primary inductor may be coupled between a collector of the first-stage transistor 238 and a first supply voltage 244. In some embodiments, the first supply voltage 244, primary inductor, and/or a third capacitor 246 may be coupled together at a third node. The secondary inductor may be coupled between the base of the first second-stage transistor 260 and the base of the second second-stage transistor 258. In some embodiments, a fourth capacitor 256 may be coupled between the secondary inductor and the base of the first second-stage transistor 260 and/or a fifth capacitor 252 may be coupled between the secondary inductor and the base of the second second-stage transistor 258. The fourth capacitor 256, second bias resistor 224, and/or base of the first second-stage transistor 260 may be coupled together at a fourth node. In some embodiments, the fifth capacitor 252, third bias resistor 226, and/or base of the second second-stage transistor 258 may be coupled together at a fifth node.

In some embodiments, a sixth capacitor 262 may be coupled between the collector and the emitter of the first second-stage transistor 260. A seventh capacitor 264 may be coupled between the collector and the emitter of the second second-stage transistor 258.

The power amplifier 200 may further comprise a second transformer 268, which may include a primary inductor and/or a secondary inductor. The primary inductor may be coupled between the collector of the first second-stage transistor 260 and the collector of the second second-stage transistor 258. In some embodiments, the primary inductor may be coupled to a second supply voltage 266. The secondary inductor may be coupled between an eighth capacitor 270 and the RF output 272.

In some embodiments, the power amplifier 200 may comprise one or more fixed resistors, which can include a first fixed resistor 240, a second fixed resistor 248, a third fixed resistor 254, and/or a fourth fixed resistor 250. The first fixed resistor 240 may be coupled across the primary inductor of the first transformer 242. In some embodiments, a first side of the first fixed resistor 240, a first side of the primary inductor of the first transformer 242, and/or the emitter of the first-stage transistor 238 may be coupled together at a node. A second side of the first fixed resistor 240, a second side of the primary inductor of the first transformer 242, the third capacitor 246, and/or the first voltage supply 244 may be coupled together at a node.

The second fixed resistor 248 may be coupled across the secondary inductor of the first transformer 242. In some embodiments, a first side of the secondary inductor of the first transformer 242, a first side of the second fixed resistor 248, the third resistor 254, and/or the fourth capacitor 256 may be coupled together at a node. The second side of the second fixed resistor 248, the second side of the second fixed resistor 248, the fourth fixed resistor 250, and/or the fifth capacitor 252 may be coupled together at a node.

The second resistor 248 may be configured to represent a virtual ground due at least in part to its placement across the first transformer 242 and/or across the secondary inductor of the first transformer 242. A middle of the second resistor 248 may not be physically connected to ground but may perform as if it is coupled to ground.

The one or more fixed resistors may be configured to be reduced in value until the stability of the power amplifier 200 over extreme conditions (e.g., high VSWR and/or cold temperatures) shows no oscillations. Power, efficiency, and/or gain may be degraded at nominal conditions and/or degraded to support stability at extreme conditions.

In some embodiments, one or more stabilizing resistors may be replaced with variable resistors. For example, at nominal temperatures, resistor values may be relatively high, causing relatively little degradation to performance. At cold temperatures, resistor values may decrease, resulting in improved stability.

Figure 3:
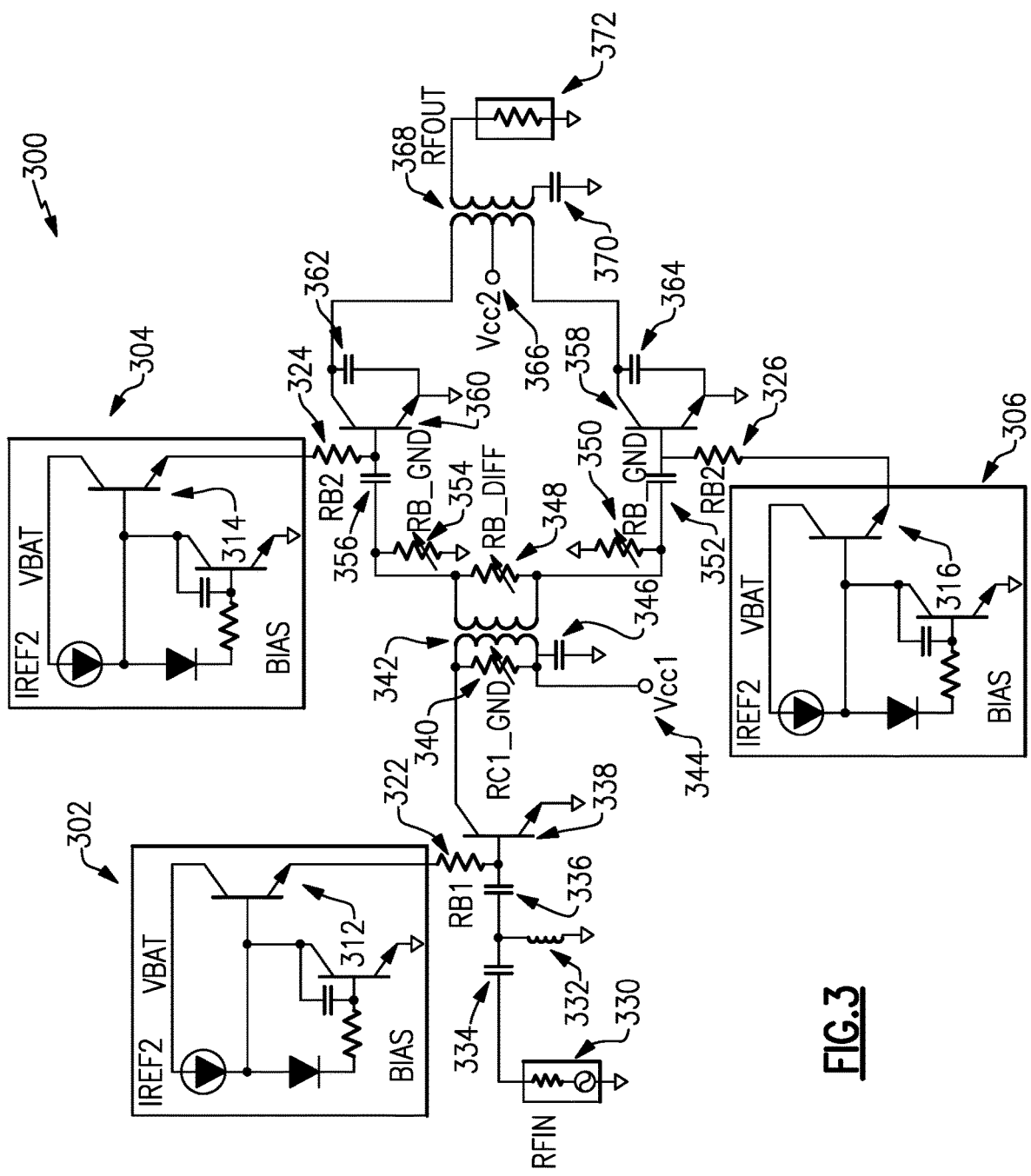
FIG. 3 illustrates a power amplifier having one or more variable resistors in accordance with one or more embodiments.

FIG. 3 illustrates a power amplifier 300 having one or more variable resistors in accordance with one or more embodiments. Variable resistors, when driven to a null resistance, may be configured to short out a signal through the power amplifier 300. Moreover, when the variable resistors are driven to infinitely high resistance, they may present no resistive loading on the base side of the power amplifier 300. In some embodiments, resistance values of the variable resistors of the power amplifier 300 may be driven as large of resistance values as possible at temperatures at or near ambient temperature. As temperature drops, resistance of the variable resistors may be dropped such that the power amplifier 300 experiences more attenuation that may load down the base of the second and/or final stage to improve oscillation of the power amplifier 300.

The power amplifier may comprise a first bias circuit 302 including a first emitter follower 312 (e.g., a BJT), a second bias circuit 304 including a second emitter follower 314 (e.g., a BJT), and/or a third bias circuit 306 including a third emitter follower 316 (e.g., a BJT). A first bias resistor 322 may be coupled (e.g., via coupling circuitry) between the first emitter follower 312 and a first-stage transistor 338 (e.g., a BJT). A second bias resistor 324 may be coupled between the second emitter follower 314 and a first second-stage transistor 360 (e.g., a BJT). A third bias resistor 326 (e.g., having an equal resistance to the second bias resistor 324) may be coupled between the third emitter follower 316 and a second second-stage transistor 358 (e.g., a BJT).

In some embodiments, the first-stage transistor 238 and/or additional transistors of the power amplifier 300 may be in a triode region and/or may comprise a temperature sensor. One or more transistors may be controlled using a controller and/or may utilize a temperature coefficient that may flip based on sensed temperature.

The power amplifier 300 may comprise an RF input 330 and/or an RF output 372. The RF input 330 may comprise an oscillator and/or a resistor. The RF input 330 may be coupled to a first capacitor 334. The first capacitor 334, a first inductor 332, and/or a second capacitor 336 may be coupled together at a first node. The second capacitor 336, first bias resistor 322, and/or the base of the first-stage transistor 338 may be coupled together at a second node.

The power amplifier 300 may comprise a first transformer 342, which may include a primary inductor and/or a secondary inductor. The primary inductor may be coupled between a collector of the first-stage transistor 338 and a first supply voltage 344. In some embodiments, the first supply voltage 344, primary inductor, and/or a third capacitor 346 may be coupled together at a third node. The secondary inductor may be coupled between the base of the first second-stage transistor 360 and the base of the second second-stage transistor 358. In some embodiments, a fourth capacitor 356 may be coupled between the secondary inductor and the base of the first second-stage transistor 360 and/or a fifth capacitor 352 may be coupled between the secondary inductor and the base of the second second-stage transistor 358. The fourth capacitor 356, second bias resistor 324, and/or base of the first second-stage transistor 360 may be coupled together at a fourth node. In some embodiments, the fifth capacitor 352, third bias resistor 326, and/or base of the second second-stage transistor 358 may be coupled together at a fifth node.

In some embodiments, the first supply voltage 344 may be proportional to temperature. The power amplifier 300 may additionally or alternatively comprise a variable DC supply voltage. In some embodiments, the power amplifier may comprise one or more bias FETs having gate-source voltages configured to compensate for gate-source voltage of one or more of the variable resistors of the power amplifier 300.

In some embodiments, a sixth capacitor 362 may be coupled between the collector and the emitter of the first second-stage transistor 360. A seventh capacitor 364 may be coupled between the collector and the emitter of the second second-stage transistor 358.

The power amplifier 300 may further comprise a second transformer 368, which may include a primary inductor and/or a secondary inductor. The primary inductor may be coupled between the collector of the first second-stage transistor 360 and the collector of the second second-stage transistor 358. In some embodiments, the primary inductor may be coupled to a second supply voltage 366. The secondary inductor may be coupled between an eighth capacitor 370 and the RF output 372.

In some embodiments, the power amplifier 300 may comprise one or more variable resistors, which can include a first variable resistor 340, a second variable resistor 348, a third variable resistor 354, and/or a fourth variable resistor 350. The first variable resistor 340 may be coupled across the primary inductor of the first transformer 342. In some embodiments, a first side of the first variable resistor 340, a first side of the primary inductor of the first transformer 342, and/or the emitter of the first-stage transistor 338 may be coupled together at a node. A second side of the first variable resistor 340, a second side of the primary inductor of the first transformer 342, the third capacitor 346, and/or the first voltage supply 344 may be coupled together at a node.

The second variable resistor 348 may be coupled across the secondary inductor of the first transformer 342. In some embodiments, a first side of the secondary inductor of the first transformer 342, a first side of the second variable resistor 348, the third resistor 354, and/or the fourth capacitor 356 may be coupled together at a node. The second side of the second variable resistor 348, the second side of second variable resistor 348, the fourth variable resistor 350, and/or the fifth capacitor 352 may be coupled together at a node.

In some embodiments, the power amplifier 300 may comprise a single variable resistor. For example, the second variable resistor 348, third variable resistor 354, and/or fourth variable resistor 350 may be removed. The first variable resistor 340 may be configured to provide improved stability to the power amplifier 300 in such embodiments.

Embodiments described herein can provide improved stability at the worst-case conditions (e.g., where power and/or efficiency may not be specified) without incurring degradation in power, efficiency, and/or gain at nominal conditions. This leads to a design that is highly marketable while still being robust over extreme conditions.

Some embodiment power amplifiers described herein may be applicable for integration within 5th generation (5G) and/or MLS-ET devices. Some embodiments described herein may be applicable to maximum power support of 5G devices, as well as to various dispersion requirements of 5G devices. Moreover, the power amplifiers described herein may be applicable to Doherty linearization across frequency and power as part of, for example, QuadHERO, etc.

Figure 4:
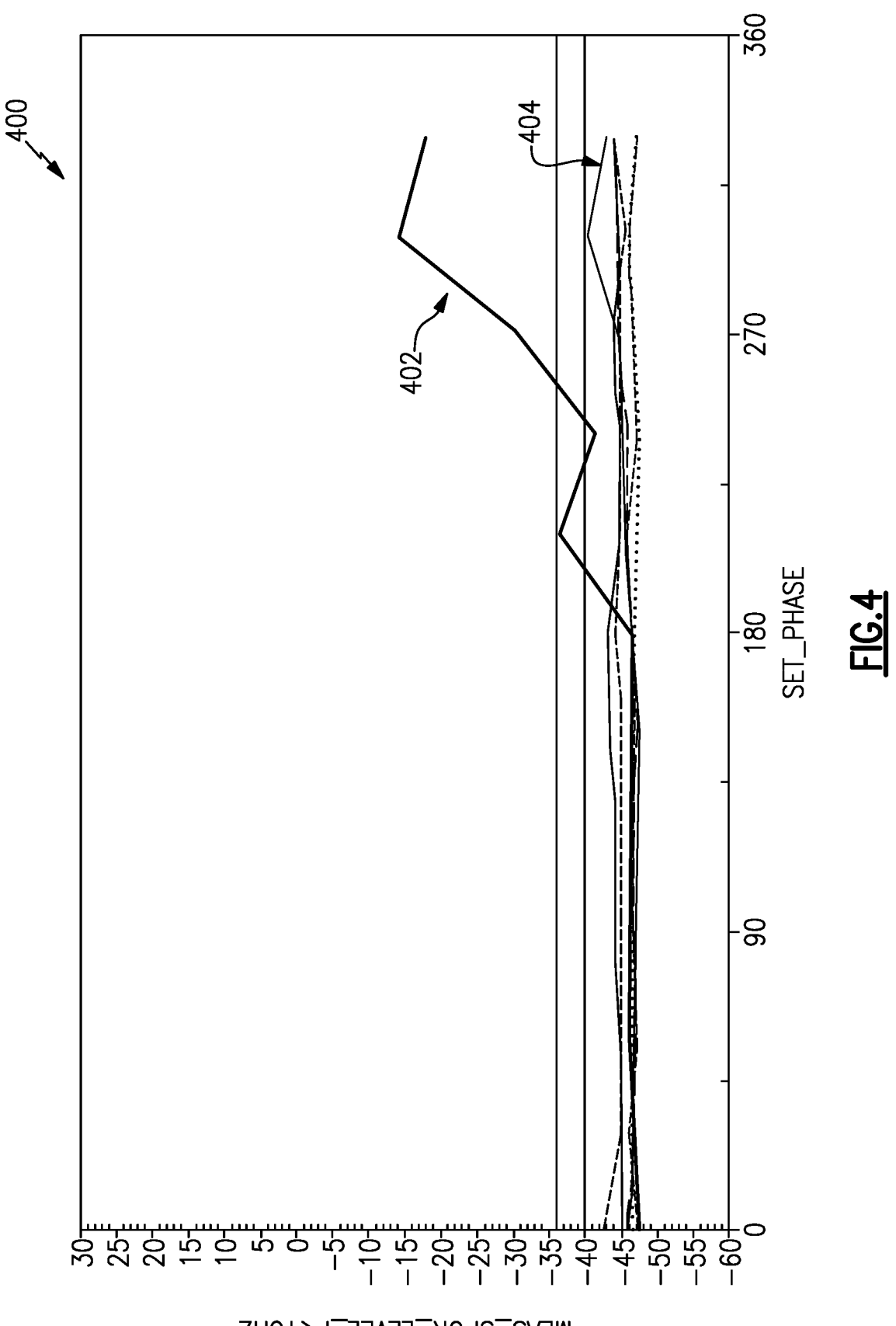
FIG. 4 provides a graph illustrating measure spur levels as a function of load phase for different resistance values of one or more variable resistors of a power amplifier in accordance with one or more embodiments.

FIG. 4 provides a graph 400 illustrating measure spur levels as a function of load phase for different resistance values of one or more variable resistors of a power amplifier in accordance with one or more embodiments. A first plot 402 illustrates spur levels of a power amplifier in which at least a first variable resistor (e.g., the first variable resistor 340 of FIG. 3) is set to a high resistance value and a second plot 404 illustrates spur levels of the power amplifier in which at least the first variable resistor (e.g., the first variable resistor 340 of FIG. 3) is set to a low resistance value. As shown in the graph 400, the power amplifier may have improved stability by reducing resistance values of at least the first variable resistor in cold and/or extreme conditions.

Figure 5:
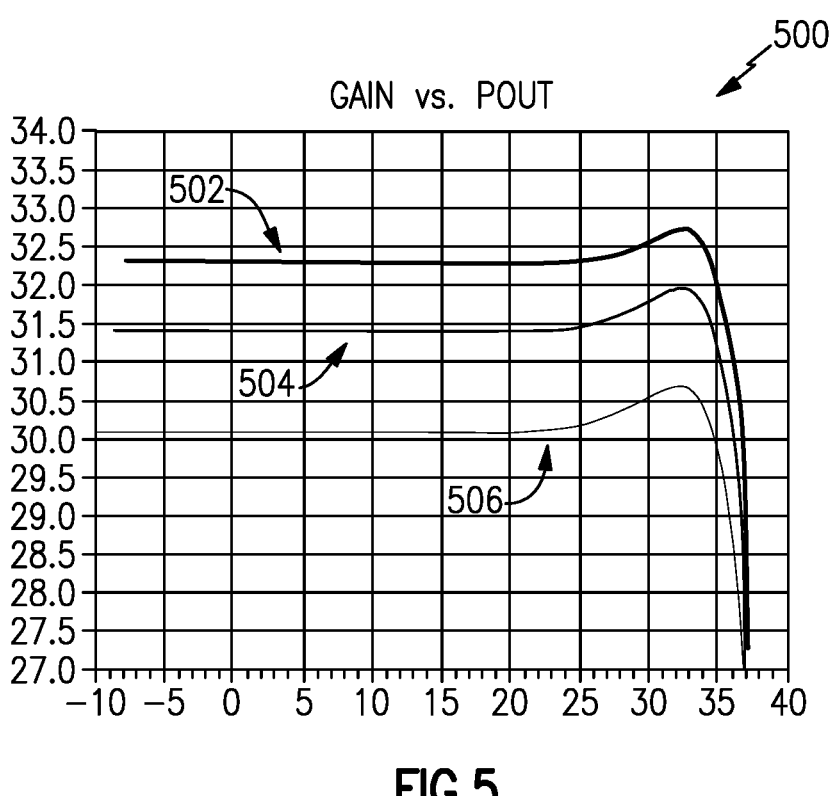
FIG. 5 provides a graph illustrating gain values vs output power.

FIG. 5 provides a graph 500 illustrating gain values vs. output power for an example power amplifier without variable resistors at different temperatures in accordance with one or more embodiments. A first plot 502 represents cold temperatures, a second plot 504 illustrates nominal temperature, and a third plot 506 illustrates hot temperatures. A shown in the graph 500, the power amplifier may experience a large variance between nominal temperatures and cold temperatures.

Figure 6:
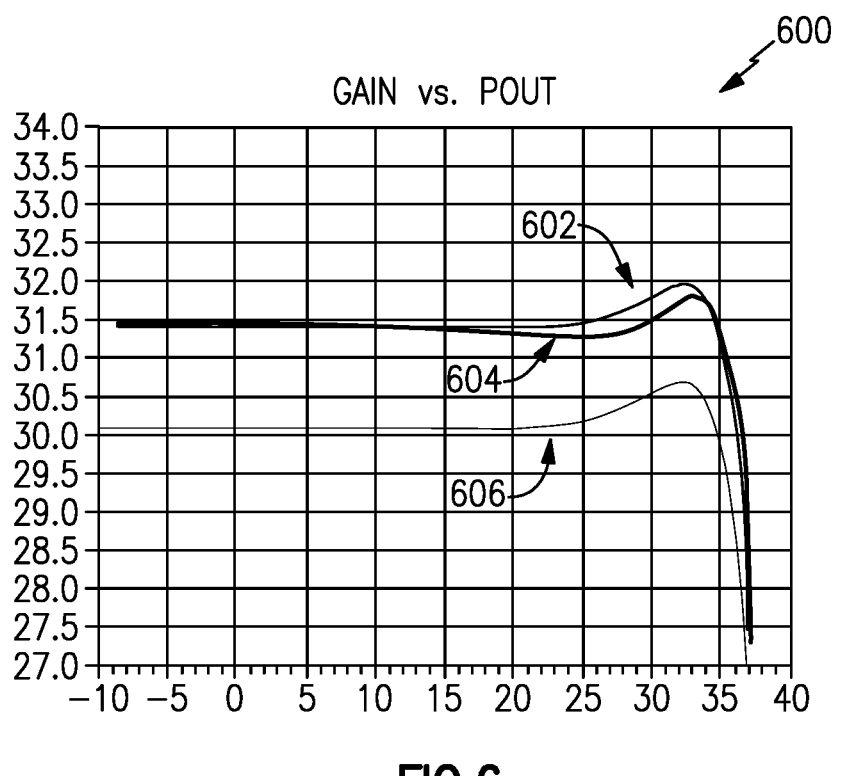
FIG. 6 provides a graph illustrating gain values vs output power.

FIG. 6 provides a graph 600 illustrating gain values vs. output power for an example power amplifier including one or more variable resistors at different temperatures in accordance with one or more embodiments. A first plot 602 represents cold temperatures, a second plot 604 illustrates nominal temperature, and a third plot 606 illustrates hot temperatures. A shown in the graph 600, the power amplifier may advantageously experience little or no variation between nominal temperatures and cold temperatures.

Figure 7:
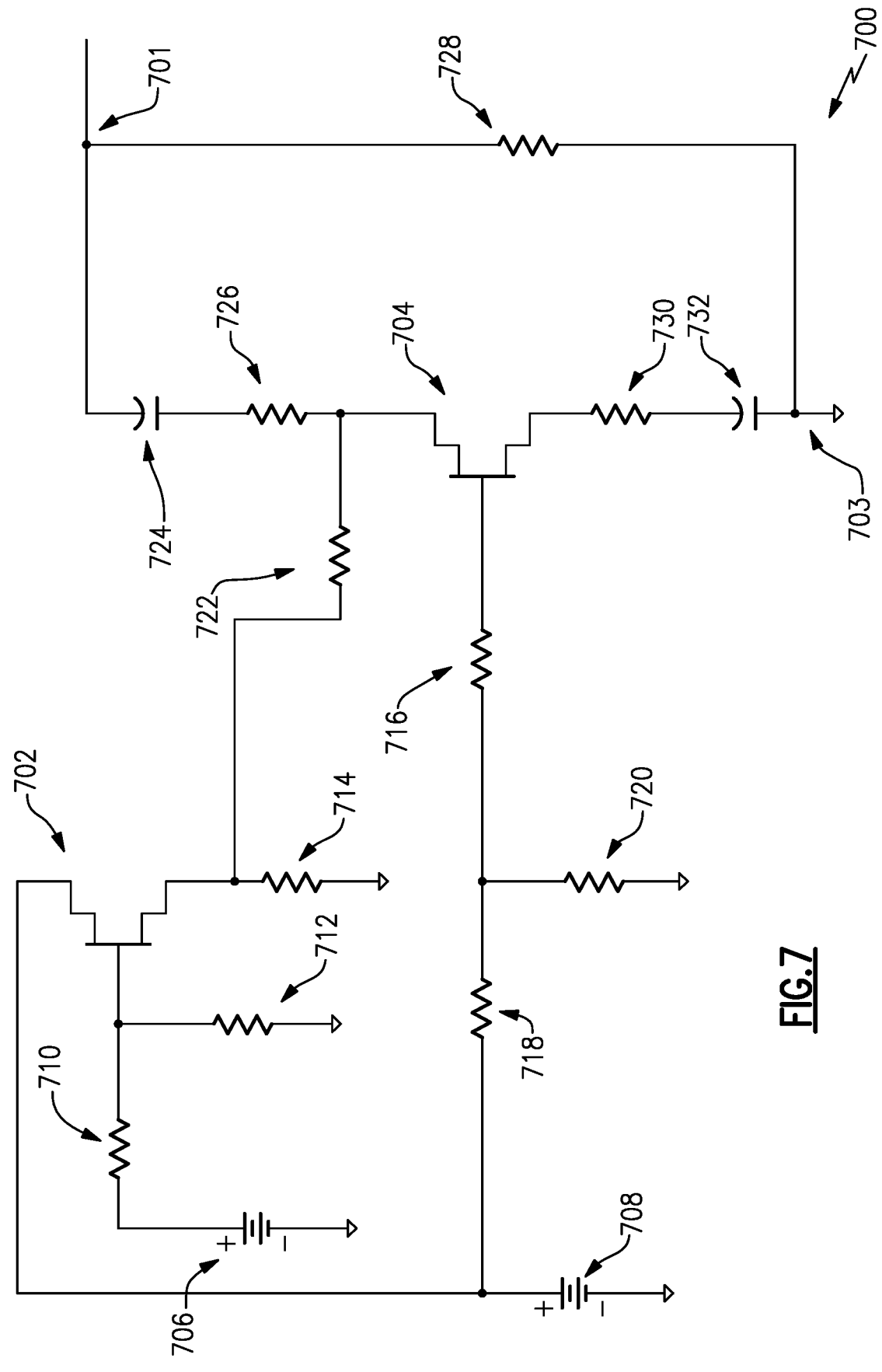
FIG. 7 provides a circuit diagram for another example power amplifier comprising one or more variable resistors in accordance with one or more embodiments.

FIG. 7 provides a circuit diagram for another example power amplifier 700 comprising one or more variable resistors in accordance with one or more embodiments. The power amplifier 700 may comprise a first voltage source 706 which may include a temperature sensor such that the first voltage source 706 may be proportional to the temperature of the power amplifier 700 and/or may generate voltage values that may be proportional to temperature values. The power amplifier 700 may further comprise a second voltage source 708 which may be a fixed and/or direct current (DC) supply voltage. The first voltage source 706 may be coupled (e.g., via coupling circuitry) in series with a first resistor 710. The first resistor 710, a second resistor 712, and/or a gate of a first transistor 702 (e.g., a FET) may be coupled together at a node. A source of the first transistor 702, a third resistor 714, and/or a fourth resistor 722 may be coupled together at a node. A drain of the first transistor 702, the second voltage source 708, and/or a fifth resistor 718 may be coupled together at another node. The fifth resistor 718, a sixth resistor 720, and/or a seventh resistor 716 may be coupled together at a node. The seventh resistor 716 may be coupled to a gate of a second transistor 704 (e.g., a FET). A drain of the second transistor 704, the fourth resistor 722, and/or an eighth resistor 726 may be coupled together at a node. The eighth resistor 726 may further be coupled to a first capacitor 724. A source of the second transistor 704 may be coupled to a ninth resistor 730. The ninth resistor 730 may be coupled between the source of the second transistor 704 and a cathode of a second capacitor 732. A tenth resistor 728 may be coupled between the first capacitor 724 and the second capacitor 732. A cathode of the first capacitor 724 and the tenth resistor 728 may be coupled to an input node 701. An anode of the second capacitor 732 and/or the tenth resistor 728 may be coupled to an output node 703.

In some embodiments, the first resistor 710, second resistor 712, third resistor 714, and/or fourth resistor 722 may be variable resistors. The first transistor 702 may be configured to compensate for gate-to-source voltages at one or more variable resistors of the power amplifier 700. For example, the gate-to-source voltage at the first transistor 702 may be configured to compensate for the gate-to-source voltages of the one or more variable resistors.

Figure 8:
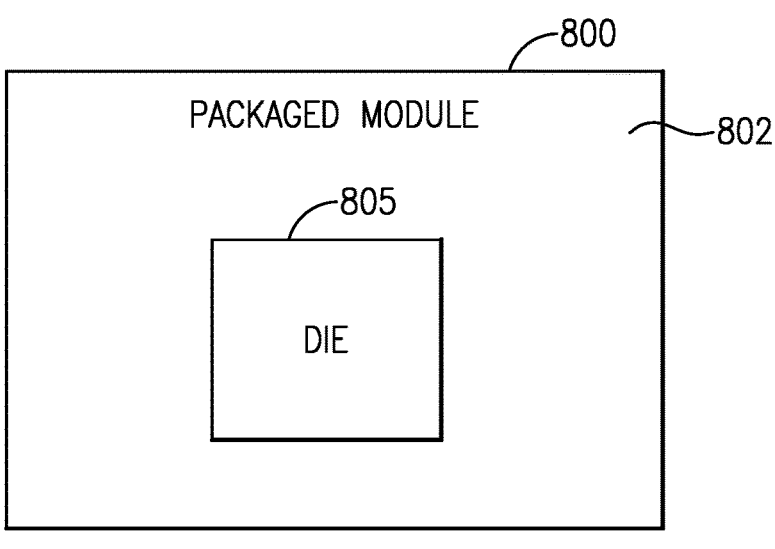
FIG. 8 shows a die implemented in a packaged module.

FIG. 8 shows a die 805 implemented in a packaged module 800. Such a packaged module can include a packaging substrate 802 configured to receive a plurality of components.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart phone, a hand-held wireless device with or without phone functionality, a wireless tablet, etc.

Figure 9:
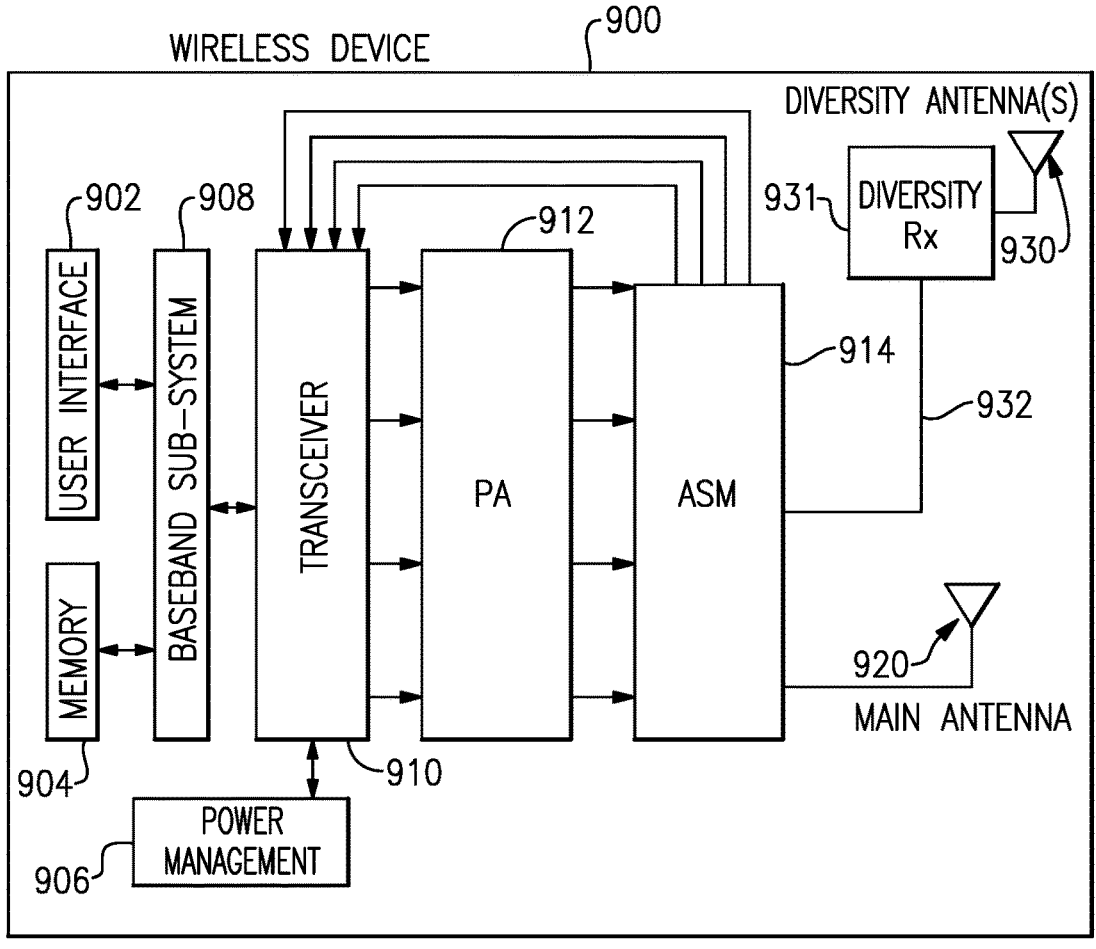
FIG. 9 depicts an example wireless device having one or more advantageous features described herein.

FIG. 9 depicts an example wireless device 900 having one or more advantageous features described herein. In some embodiments, a module that includes one or more power amplifiers can also include one or more clamps having one or more features as described herein.

In the example of FIG. 9, power amplifiers (PAs) are depicted in a PA module 912; however, it will be understood that such power amplifiers can be implemented in one or more functional blocks, one or more devices such as die or modules, etc. Such power amplifiers can receive their respective RF signals from a transceiver 910 that can be configured and operated to generate RF signals to be amplified and transmitted, and to process received signals. The transceiver 910 is shown to interact with a baseband subsystem 908 that is configured to provide conversion between data and/or voice signals suitable for a user and RF signals suitable for the transceiver 910. The transceiver 910 is also shown to be connected to a power management component 906 that is configured to manage power for the operation of the wireless device 900. Such power management can also control operations of the baseband sub-system 908 and other components of the wireless device 900.

The baseband sub-system 908 is shown to be connected to a user interface 902 to facilitate various input and output of voice and/or data provided to and received from the user. The baseband sub-system 908 can also be connected to a memory 904 that is configured to store data and/or instructions to facilitate the operation of the wireless device, and/or to provide storage of information for the user.

In the example of FIG. 9, a diversity receive (DRx) module 931 can be implemented between one or more diversity antennas (e.g., diversity antenna 930) and the front-end module. Such a configuration can allow an RF signal received through the diversity antenna 930 to be processed (in some embodiments, including amplification by an LNA) with little or no loss of and/or little or no addition of noise to the RF signal from the diversity antenna 930. Such processed signal from the DRx module 940 can then be routed to the front-end module through one or more signal paths. In some embodiments, the wireless device 900 may or may not include the foregoing DRx functionality.

In the example of FIG. 9, a plurality of antennas (e.g., 920a, 920b) can be configured to, for example, facilitate transmission of RF signals from the PA module 912. In some embodiments, receive operations can also be achieved through some or all of the antennas 920a, 920b.

Some implementations of the present disclosure relate to a power amplifier including: a first transistor; a first transformer; a first variable resistor; a first bias circuit; and coupling circuitry configured to couple the first transformer, a first end of the first variable resistor, and a collector of the first transistor at a first node, the first transformer and a second end of the first variable resistor at a second node, and the first bias circuit and a base of the first transistor at a third node.

In some aspects, the techniques described herein relate to a power amplifier wherein the first transformer includes a primary inductor and a secondary inductor.

In some aspects, the techniques described herein relate to a power amplifier wherein the coupling circuitry is further configured to couple a first end of the primary inductor, the first end of the first variable resistor, and the collector of the first transistor at the first node.

In some aspects, the techniques described herein relate to a power amplifier wherein the coupling circuitry is further configured to couple a second end of the primary inductor and the second end of the first variable resistor at the second node.

In some aspects, the techniques described herein relate to a power amplifier further including a second variable resistor.

In some aspects, the techniques described herein relate to a power amplifier wherein the coupling circuitry is further configured to couple a first end of the secondary inductor to a first end of the second variable resistor.

In some aspects, the techniques described herein relate to a power amplifier wherein the coupling circuitry is further configured to couple a second end of the secondary inductor to a second end of the second variable resistor.

In some aspects, the techniques described herein relate to a power amplifier further including a third variable resistor.

In some aspects, the techniques described herein relate to a power amplifier wherein the coupling circuitry is further configured to couple a first end of the second variable resistor to the third variable resistor.

In some aspects, the techniques described herein relate to a power amplifier further including a fourth variable resistor.

In some aspects, the techniques described herein relate to a power amplifier wherein the coupling circuitry is further configured to couple a second end of the second variable resistor to the fourth variable resistor.

In some aspects, the techniques described herein relate to a power amplifier further including a second bias circuit.

In some aspects, the techniques described herein relate to a power amplifier wherein the coupling circuitry is further configured to couple the second bias circuit to the secondary inductor.

In some aspects, the techniques described herein relate to a power amplifier further including a capacitor coupled between the second bias circuit and the secondary inductor.

In some aspects, the techniques described herein relate to a power amplifier wherein the coupling circuitry is further configured to couple the first transformer in parallel with the first variable resistor.

In some aspects, the techniques described herein relate to a circuit including: a first transistor; a first transformer including a primary inductor and a secondary inductor; a first variable resistor; a first bias circuit; and coupling circuitry configured to couple a first end of the primary inductor, a first end of the first variable resistor, and a collector of the first transistor at a first node, a second end of the primary inductor and a second end of the first variable resistor at a second node, and the second bias circuit and a base of the first transistor at a third node.

In some aspects, the techniques described herein relate to a circuit further including a second bias circuit.

In some aspects, the techniques described herein relate to a circuit further including a second variable resistor.

In some aspects, the techniques described herein relate to a circuit wherein the coupling circuitry is further configured to couple second bias circuit to the second variable resistor.

In some aspects, the techniques described herein relate to a circuit wherein the coupling circuitry is further configured to couple the second variable resistor to the secondary inductor of the first transformer.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid-state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier comprising:
a first transistor;
a first transformer including a primary inductor and a secondary inductor;
a first variable resistor;
a second variable resistor;
a first bias circuit; and
coupling circuitry configured to couple the first transformer, a first end of the first variable resistor, and a collector of the first transistor at a first node, the first transformer and a second end of the first variable resistor at a second node, and the first bias circuit and a base of the first transistor at a third node.

2. The power amplifier of claim 1 wherein the coupling circuitry is further configured to couple a first end of the primary inductor, the first end of the first variable resistor, and the collector of the first transistor at the first node.

3. The power amplifier of claim 1 wherein the coupling circuitry is further configured to couple a second end of the primary inductor and the second end of the first variable resistor at the second node.

4. The power amplifier of claim 1 wherein the coupling circuitry is further configured to couple a first end of the secondary inductor to a first end of the second variable resistor.

5. The power amplifier of claim 1 wherein the coupling circuitry is further configured to couple a second end of the secondary inductor to a second end of the second variable resistor.

6. The power amplifier of claim 1 further comprising a third variable resistor.

7. The power amplifier of claim 6 wherein the coupling circuitry is further configured to couple a first end of the second variable resistor to the third variable resistor.

8. The power amplifier of claim 7 further comprising a fourth variable resistor.

9. The power amplifier of claim 8 wherein the coupling circuitry is further configured to couple a second end of the second variable resistor to the fourth variable resistor.

10. The power amplifier of claim 1 further comprising a second bias circuit.

11. The power amplifier of claim 10 wherein the coupling circuitry is further configured to couple the second bias circuit to the secondary inductor.

12. The power amplifier of claim 10 further comprising a capacitor coupled between the second bias circuit and the secondary inductor.

13. The power amplifier of claim 1 wherein the coupling circuitry is further configured to couple the first transformer in parallel with the first variable resistor.

14. A circuit comprising:
a first transistor;
a first transformer including a primary inductor and a secondary inductor;
a first variable resistor;
a first bias circuit;
a second bias circuit; and
coupling circuitry configured to couple a first end of the primary inductor, a first end of the first variable resistor, and a collector of the first transistor at a first node, a second end of the primary inductor and a second end of the first variable resistor at a second node, and the first bias circuit and a base of the first transistor at a third node.

15. The circuit of claim 14 further comprising a second variable resistor.

16. The circuit of claim 15 wherein the coupling circuitry is further configured to couple the second bias circuit to the second variable resistor.

17. The circuit of claim 16 wherein the coupling circuitry is further configured to couple the second variable resistor to the secondary inductor of the first transformer.

18. A circuit comprising:
a first transistor;
a first transformer;
a first variable resistor;
a second variable resistor;
a first bias circuit; and
coupling circuitry configured to couple the first transformer, a first end of the first variable resistor, and a collector of the first transistor at a first node, the first transformer and a second end of the first variable resistor at a second node, and the first bias circuit and a base of the first transistor at a third node.

19. The circuit of claim 18 wherein the coupling circuitry is further configured to couple the second variable resistor to the first transformer.

* * * * *